United States Patent
Lee et al.

(10) Patent No.: US 7,388,282 B2
(45) Date of Patent: *Jun. 17, 2008

(54) MICRO-ELECTRO-MECHANICAL SYSTEM (MEMS) PACKAGE HAVING HYDROPHOBIC LAYER

(75) Inventors: Yeong Gyu Lee, Gyeonggi-do (KR); Suk Kee Hong, Seoul (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 101 days.

This patent is subject to a terminal disclaimer.

(21) Appl. No.: 11/180,979

(22) Filed: Jul. 12, 2005

(65) Prior Publication Data

US 2006/0076666 A1    Apr. 13, 2006

(30) Foreign Application Priority Data

Oct. 7, 2004   (KR) .................. 10-2004-0079930

(51) Int. Cl.
*H01L 32/02*   (2006.01)
(52) U.S. Cl. ................ 257/680; 257/710; 257/E23.128
(58) Field of Classification Search ............... 257/414, 257/415, 419, 433, 710, 711, 678, 680, 684, 257/E23.128

See application file for complete search history.

(56) References Cited

U.S. PATENT DOCUMENTS

| | | | | |
|---|---|---|---|---|
| 6,303,986 B1 * | 10/2001 | Shook | ....................... | 257/680 |
| 7,078,804 B2 * | 7/2006 | Hong et al. | ................. | 257/730 |
| 7,102,224 B2 * | 9/2006 | Pahl | .......................... | 257/704 |
| 2005/0184304 A1 * | 8/2005 | Gupta et al. | .................. | 257/98 |
| 2006/0076634 A1 * | 4/2006 | Palmateer et al. | .......... | 257/415 |

* cited by examiner

*Primary Examiner*—Howard Weiss
*Assistant Examiner*—Hoa B Trinh
(74) *Attorney, Agent, or Firm*—Christensen O'Connor Johnson Kindness PLLC

(57) ABSTRACT

A micro-electro-mechanical system (MEMS) package having a hydrophobic layer is disclosed. The MEMS package includes: a base substrate, with an MEMS element provided on a surface of the base substrate; a lid, spaced apart from the MEMS element provided on the base substrate and covering the MEMS element; a side sealing member provided on a side surface of the base substrate and the surface of the lid, thus hermetically sealing the MEMS element from an external environment; and a hydrophobic layer which covers the part of the side sealing member that is exposed to the external environment, thus removing the hydrophilia from the side sealing member.

8 Claims, 1 Drawing Sheet

MICRO-ELECTRO-MECHANICAL SYSTEM (MEMS) PACKAGE HAVING HYDROPHOBIC LAYER

BACKGROUND OF THE INVENTION

1. Field of the Invention

The present invention relates, in general, to micro-electromechanical system (MEMS) packages having hydrophobic layers and, more particularly, to an MEMS package in which a hydrophobic layer is formed on a side sealing member that bonds and hermetically seals an MEMS element in the MEMS package, thus allowing the MEMS package to have an excellent seal to protect the MEMS element from the external environment.

2. Description of the Related Art

In recent years, various applications for MEMS and various products using MEMS have been proposed and practically used in a variety of industrial fields.

Most products, fabricated using MEMS, include mobile MEMS elements therein and have fine micrometer-sized structures, so that the MEMS products are mainly affected by surface-energy rather than mass-energy.

Thus, to provide MEMS products having stable and reliable operational performances, the MEMS products must have structures for protecting the mobile MEMS elements from the external environments, such as mechanical and chemical environment, and for isolating the mobile MEMS elements from a variety of environmental factors which may affect the surface-energy of the products. In an effort to accomplish the above-mentioned technical requirements, hermetic packaging techniques for the MEMS elements have been actively studied.

To hermetically package the MEMS elements, a soldering method using a metal soldering technique has been typically used in the related art.

FIG. 1 is a sectional view illustrating the construction of a conventional MEMS package, which is produced through a conventional soldering method and is disclosed in U.S. Pat. No. 6,303,986 (corresponding to Korean Patent Publication No. 2001-0053615).

In the conventional MEMS package disclosed in U.S. Pat. No. 6,303,986, a first solderable material 120 is formed on the upper surface of a passivation layer 114, while a second solderable material 124 is formed on the lower surface of a lid 122. The two solderable materials 120 and 124 are joined together by solder 126, thus sealing the MEMS package. The soldering method using the solder 126 creates an excellent seal for the MEMS package and imparts high operational reliability to the MEMS package.

However, the conventional soldering methods of producing the MEMS packages are problematic in that the soldering requires high process temperatures, difficult process conditions and high manufacturing costs.

In an effort to overcome the above-mentioned problems, MEMS packages having hermetic sealing members, such as epoxy sealing members, have been actively studied.

SUMMARY OF THE INVENTION

Accordingly, the present invention has been made keeping in mind the above problems occurring in the related art, and an object of the present invention is to provide an MEMS package which provides an excellent seal from the external environment to an MEMS element.

In order to achieve the above object, an MEMS package is provided, comprising: a base substrate, with an MEMS element provided on a surface of the base substrate; a lid being spaced apart from the MEMS element provided on the base substrate and covering the MEMS element; a side sealing member provided on a side surface of the base substrate and the surface of the lid, thus hermetically sealing the MEMS element from the external environment; and a hydrophobic layer which covers the part of the side sealing member that is exposed to the external environment, thus removing the hydrophilia from the side sealing member.

In the MEMS package having the hydrophobic layer according to the present invention, the lid is preferably made of a transmissive material so that incident light beams can be transmitted through the lid.

In the MEMS package having the hydrophobic layer according to the present invention, the lid is preferably provided with a nonreflective coat layer on at least one of opposite surfaces thereof, thus increasing light transmissivity of the incident light beams.

In the MEMS package having the hydrophobic layer according to the present invention, the hydrophobic layer is preferably configured as a multi-layered structure.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Herein below, an MEMS package having a hydrophobic layer according to the present invention will be described in detail with reference to the accompanying drawings.

Figure 1:
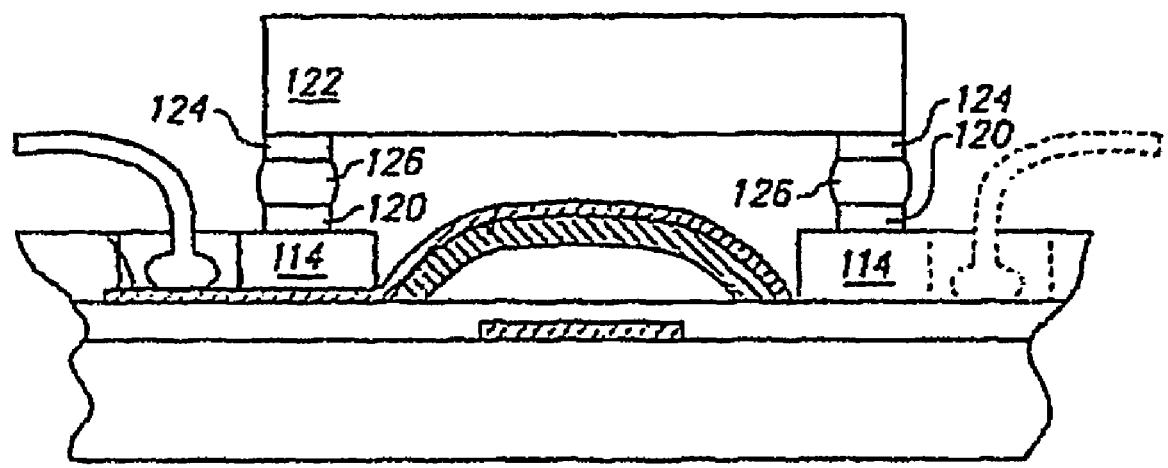
FIG. 1 is a sectional view illustrating the construction of a conventional MEMS package.
Figure 2:
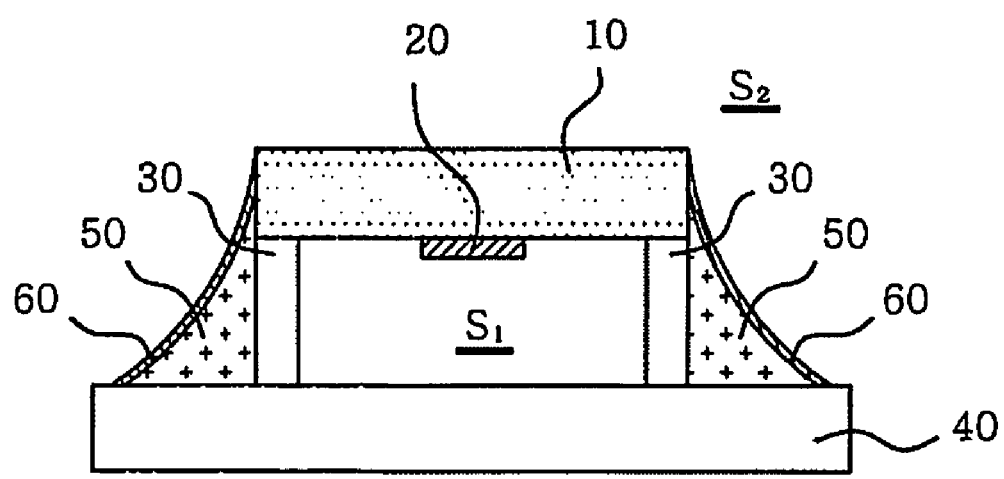
FIG. 2 is a sectional view illustrating the construction of an MEMS package having a hydrophobic layer according to an embodiment of the present invention.

FIG. 2 is a sectional view illustrating the construction of an MEMS package having a hydrophobic layer according to an embodiment of the present invention.

As shown in FIG. 2, the MEMS package having a hydrophobic layer according to the present invention comprises a base substrate 10 on which an MEMS element 20 is provided, a spacer 30, a lid 40, a side sealing member 50 and a hydrophobic layer 60.

In the present invention, the base substrate 10 may be a semiconductor substrate on which the MEMS element 20 is formed or may be a printed circuit board (PCB) to which the MEMS element 20 is mounted and which thus functions as a medium.

In the present invention, examples of MEMS elements 20 are diffractive, reflective or transmissive light modulating elements, optical elements or display elements used in a variety of optical devices, such as optical memory units, optical displays, printers, optical interconnections, and hologram displays.

The spacer 30 is formed on the base substrate 10 at a position around the MEMS element 20 and provides an MEMS operational space $S_1$ in which the MEMS element 20 is operated.

In the preferred embodiment of the present invention, the spacer 30 may be made of a conductive material such that the spacer 30 acts as a signal line which transmits electric signals between the MEMS element 20 and an external electronic device or between electric circuits of the MEMS package.

The lid 40 is mounted to an end surface of the spacer 30 which is opposite to the end surface of the spacer 30 mounted to the base substrate 10. The lid 40 defines the MEMS operational space $S_1$ in the MEMS package in cooperation with both the base substrate 10 and the spacer 30.

In the embodiment of the present invention, the lid 40 is preferably made of a transmissive material, for example, glass, so that incident light beams can be transmitted through the lid 40. Furthermore, the lid 40 is preferably provided with a nonreflective coat layer on at least one of opposite surfaces thereof, thus increasing light transmissivity of the incident light beams.

The side sealing member 50, which may be made of an epoxy adhesive, is provided on a side surface of the base substrate 10 and the surface of the lid 40, thus hermetically sealing the MEMS element 20 mounted on the base substrate 10 from the external environment $S_2$.

The hydrophobic layer 60 is formed on the part of the side sealing member 50 that is exposed to the external environment $S_2$, so that the hydrophobic layer 60 removes the hydrophilia from the part of the side sealing member 50 exposed to the external environment $S_2$.

Due to the hydrophobic layer 60, moisture from the external environment $S_2$ cannot be introduced into the MEMS operational space $S_1$ through the side sealing member 50.

Described in detail, the MEMS package according to the present invention is configured such that the hydrophobic layer 60 having very low permeability is exposed to the external environment $S_2$. Therefore, the hydrophobic layer 60 increases the value P in the above-mentioned equation 1, so that the hydrophobic layer 60 makes the steam pressure in the MEMS operational space $S_1$ almost constant. Thus, the life span of MEMS products can be lengthened.

To provide the hydrophobic layer 60 on the side sealing member 50, a spraying method, in which a hydrophobic material is sprayed onto the sealing member 50 using a sprayer, a brushing method, in which the hydrophobic material is applied onto the sealing member 50 using a brush, or a dipping method, in which the hydrophobic layer is formed by slightly dipping the MEMS package into a hydrophobic solution, may be used.

In the preferred embodiment of the present invention, the hydrophobic layer 60 is preferably configured as a multi-layered structure, so that the layer 60 can prevent moisture and other gas from passing through the side sealing member 50 to reach the MEMS operational space.

Although a preferred embodiment of the present invention has been described for illustrative purposes, those skilled in the art will appreciate that various modifications, additions and substitutions are possible, without departing from the scope and spirit of the invention as disclosed in the accompanying claims.

As is apparent from the above description, the MEMS package according to the present invention is provided with a hydrophobic layer on a side sealing member, thus having an excellent seal to protect an MEMS element from the external environment.

Furthermore, the MEMS package having the hydrophobic layer according to the present invention has an excellent seal for protecting the MEMS element from the external environment, so that the present invention imparts excellent operational reliability to the MEMS package and lengths the life span of the MEMS package.

What is claimed is:

1. A micro-electro-mechanical system (MEMS) package, comprising:
    a base substrate, with an MEMS element provided on a surface of the base substrate;
    a lid being spaced apart from the MEMS element provided on the base substrate and covering the MEMS element;
    a side sealing member provided on a side surface of the base substrate and a surface of the lid, said side sealing member of a material composition and positioned on, and spanning between, the side surface of the base substrate and on the surface of the lid to hermetically seal the MEMS element from an external environment; and
    a thin hydrophobic layer which covers part of the side sealing member exposed to the external environment, said hydrophobic layer of a composition and applied to the side sealing member to substantially prevent moisture and other gas from passing through the side sealing member.

2. The MEMS package according to claim 1, wherein the lid is made of a transmissive material so that incident light beams are transmitted through the lid.

3. The MEMS package according to claim 2, wherein the lid is provided with a nonreflective coat layer on at least one of opposite surfaces thereof, thus increasing light transmissivity of the incident light beams.

4. The MEMS package according to claim 1, wherein the hydrophobic layer is configured as a thin, multi-layered structure.

5. A micro-electro-mechanical system (MEMS) package, comprising:
    a base substrate, with an MEMS element provided on a surface of the base substrate;
    a lid covering the MEMS element;
    a spacer for spacing the lid apart from the base substrate and creating an operating chamber for the MEMS element;
    a side sealing member provided on a side surface of the base substrate, the side surface of the spacer and a surface of the lid, said side sealing member of a material composition and disposed on the side surfaces of the base substrate and spacer and on the surface of the lid to hermetically seal the MEMS element from an external environment; and
    a thin hydrophobic layer which covers part of the side sealing member exposed to the external environment, said hydrophobic layer of composition and applied to the side sealing member to substantially prevent moisture and other gas from passing through the side sealing member.

6. The MEMS package according to claim 5, wherein the lid is made of a transmissive material so that incident light beams are transmitted through the lid.

7. The MEMS package according to claim 6, wherein the lid is provided with a nonreflective coat layer on at least one of opposite surfaces thereof thus increasing light transmissivity of the incident light beams.

8. The MEMS package according to claim 5, wherein the hydrophobic layer is configured as a thin multi-layered structure.

* * * * *